(12) United States Patent
Bauer et al.

(10) Patent No.: US 11,270,046 B2
(45) Date of Patent: Mar. 8, 2022

(54) CONVERSION OF POINT CLOUD DATA POINTS INTO COMPUTER-AIDED DESIGN (CAD) OBJECTS

(71) Applicant: FARO Technologies, Inc., Lake Mary, FL (US)

(72) Inventors: Heiko Bauer, Korntal-Münchingen (DE); Denis Wohlfeld, Ludwigsburg (DE)

(73) Assignee: FARO TECHNOLOGIES, INC., Lake Mary, FL (US)

( * ) Notice: Subject to any disclaimer, the term of this patent is extended or adjusted under 35 U.S.C. 154(b) by 9 days.

(21) Appl. No.: 16/451,298

(22) Filed: Jun. 25, 2019

(65) Prior Publication Data
US 2020/0410064 A1 Dec. 31, 2020

(51) Int. Cl.
*G06F 30/23* (2020.01)
*G06T 7/73* (2017.01)
*G06T 7/33* (2017.01)
*G06N 3/08* (2006.01)

(52) U.S. Cl.
CPC .............. *G06F 30/23* (2020.01); *G06N 3/08* (2013.01); *G06T 7/33* (2017.01); *G06T 7/73* (2017.01)

(58) Field of Classification Search
None
See application file for complete search history.

(56) References Cited

U.S. PATENT DOCUMENTS

| 8,705,012 B2 | 4/2014 | Greiner et al. | |
|---|---|---|---|
| 2013/0176305 A1* | 7/2013 | Ito | G01C 15/002 345/420 |
| 2014/0192050 A1* | 7/2014 | Qiu | G06K 9/00214 345/420 |
| 2019/0178643 A1 | 6/2019 | Metzler et al. | |
| 2019/0295319 A1* | 9/2019 | Pham | G06T 15/005 |

FOREIGN PATENT DOCUMENTS

WO WO-2018138516 A1 * 8/2018 ........... G06K 9/6203

OTHER PUBLICATIONS

Ip et al.; "Retrieving Matching CAD Models by Using Partial 3D Point Clouds;" Jun. 2007; CAD Conference, Hawaii; pp. 1-11. (Year: 2007).*
Izadinia et al. ; "Scene Recomposition by Learning-based ICP;" Dec. 13, 2018; pp. 1-11; https://deepai.org/publication/scene-recomposition-by-learning-based-icp (Year: 2018).*

(Continued)

*Primary Examiner* — Peter Hoang
(74) *Attorney, Agent, or Firm* — Cantor Colburn LLP

(57) ABSTRACT

Aspects include a system and method for converting from point cloud data to computer-aided design (CAD) objects. A method includes providing a point cloud and a catalog of CAD objects. One of a plurality of points in the point cloud representing an item is selected. A CAD object in the catalog that corresponds to the item is selected. The CAD object is aligned to the item in the point cloud. A position and orientation of the aligned CAD object is output. The position and orientation are expressed in a coordinate system of the point cloud.

18 Claims, 11 Drawing Sheets

(56) References Cited

OTHER PUBLICATIONS

Chaudhuri et al.; Data-driven Suggestions for creativity support in 3D modeling; Dec. 2010; ACM Transactions on Graphics; pp. 1-10. (Year: 2010).*

Armen Avetisyan et al., "Scan2CAD: Learning CAD Model Alignment in RGB-D Scans", ARXIV Org., Cornell University, Nov. 27, 2018, 16 pages.

Extended European Search Report for Application No. 20180800. 3-1224, dated Nov. 4, 2020; 8 pages.

Hamid Izadinia et al., Scene Rewcomposition by Learning-based ICP, Arxiv. Org, Cornell University, Dec. 13, 2018, 11 pages.

Li Llngziao et al., "Supervised Fitting of Geometric Primitives to 3D Point Clouds" 2019 IEEE/CVF Conference on Computer Vision and Pattern Recognition, Jun. 15, 2019, pp. 2647-2655.

\* cited by examiner

CONVERSION OF POINT CLOUD DATA POINTS INTO COMPUTER-AIDED DESIGN (CAD) OBJECTS

BACKGROUND

The present application relates generally to scanning projects, and more specifically to converting point cloud data points into computer-aided design (CAD) objects.

The subject matter disclosed herein relates to the use of a three-dimensional (3D) laser scanner time-of-flight (TOF) coordinate measurement device. A 3D laser scanner of this type steers a beam of light to a non-cooperative target such as a diffusely scattering surface of an object. A distance meter in the device measures a distance to the object, and angular encoders measure the angles of rotation of two axles in the device. The measured distance and two angles enable a processor in the device to determine the 3D coordinates of the target.

A TOF laser scanner is a scanner in which the distance to a target point is determined based on the speed of light in air between the scanner and a target point. Laser scanners are typically used for scanning closed or open spaces such as interior areas of buildings, industrial installations and tunnels. They may be used, for example, in industrial applications and accident reconstruction applications. A laser scanner optically scans and measures objects in a volume around the scanner through the acquisition of data points representing object surfaces within the volume. Such data points are obtained by transmitting a beam of light onto the objects and collecting the reflected or scattered light to determine the distance, two-angles (i.e., an azimuth and a zenith angle), and optionally a gray-scale value. This raw scan data is collected and stored as a point cloud.

All or portions of the data points in a point cloud can be converted into a three-dimensional (3D) computer-aided design (CAD) model. Contemporary methods of performing the conversion are largely manual, resulting in a process that is labor intensive and often inaccurate due to human error.

Accordingly, while existing manners of converting point cloud data into CAD models are suitable for their intended purposes, what is needed is a system for having certain features of embodiments of the present invention.

BRIEF DESCRIPTION

According to an embodiment of the present invention, a method for converting from point cloud data to computer-aided design (CAD) objects is provided. The method includes providing a point cloud and a catalog of CAD objects. One of a plurality of points in the point cloud representing an item is selected. A CAD object in the catalog that corresponds to the item is selected. The CAD object is aligned to the item in the point cloud. A position and orientation of the aligned CAD object is output. The position and orientation are expressed in a coordinate system of the point cloud.

In addition to one or more of the features described herein, or as an alternative, further embodiments of the method may include that the selecting a point, the selecting a CAD object, the aligning, and the outputting are repeated for at least one additional item in the point cloud.

In addition to one or more of the features described herein, or as an alternative, further embodiments of the method may include that outputting is to a CAD model.

In addition to one or more of the features described herein, or as an alternative, further embodiments of the method may include that the CAD object is visualized on the point cloud.

In addition to one or more of the features described herein, or as an alternative, further embodiments of the method may include that a pair that includes the plurality of points in the point cloud represent the item and the CAD object are used as labeled training data for an artificial intelligence (AI) system that identifies CAD objects in point clouds.

In addition to one or more of the features described herein, or as an alternative, further embodiments of the method may include that prior to selecting a CAD object in the catalog, an AI system provides a suggested CAD object to the user, wherein the selecting a CAD object comprises the user selecting the suggested CAD object as the CAD object or selecting another CAD object as the CAD object.

In addition to one or more of the features described herein, or as an alternative, further embodiments of the method may include that the selecting a point in the point cloud is performed by an AI system.

In addition to one or more of the features described herein, or as an alternative, further embodiments of the method may include that the CAD object has an identifier identifying a type of the object.

In addition to one or more of the features described herein, or as an alternative, further embodiments of the method may include generating the point cloud using a three-dimensional (3D) scanner.

In addition to one or more of the features described herein, or as an alternative, further embodiments of the method may include that the scanner is a laser scanner.

According to another embodiment of the present invention, a method for converting from point cloud data to computer-aided design (CAD) objects is presented. The method includes training an artificial intelligence (AI) system to identity CAD objects in point cloud data. The training is based at least in part on training data that includes a plurality of pairs of points of point cloud data that represent an item and a corresponding CAD object. A point cloud is received. A subset of points in the point cloud representing an item and a corresponding CAD object is automatically identified by the AI system. The CAD object is aligned to the item. A position and orientation of the aligned CAD object is output. The position and orientation are expressed in a coordinate system of the point cloud.

In addition to one or more of the features described herein, or as an alternative, further embodiments of the method may include that the automatically identifying, the aligning, and the outputting are repeated for at least one additional item in the point cloud.

Other embodiments of the present invention implement the features of the above described systems in systems and in computer program products.

Technical effects of embodiments of the present disclosure include the ability to automate all or portions of a conversion from point cloud data into CAD objects.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

Figure 1:
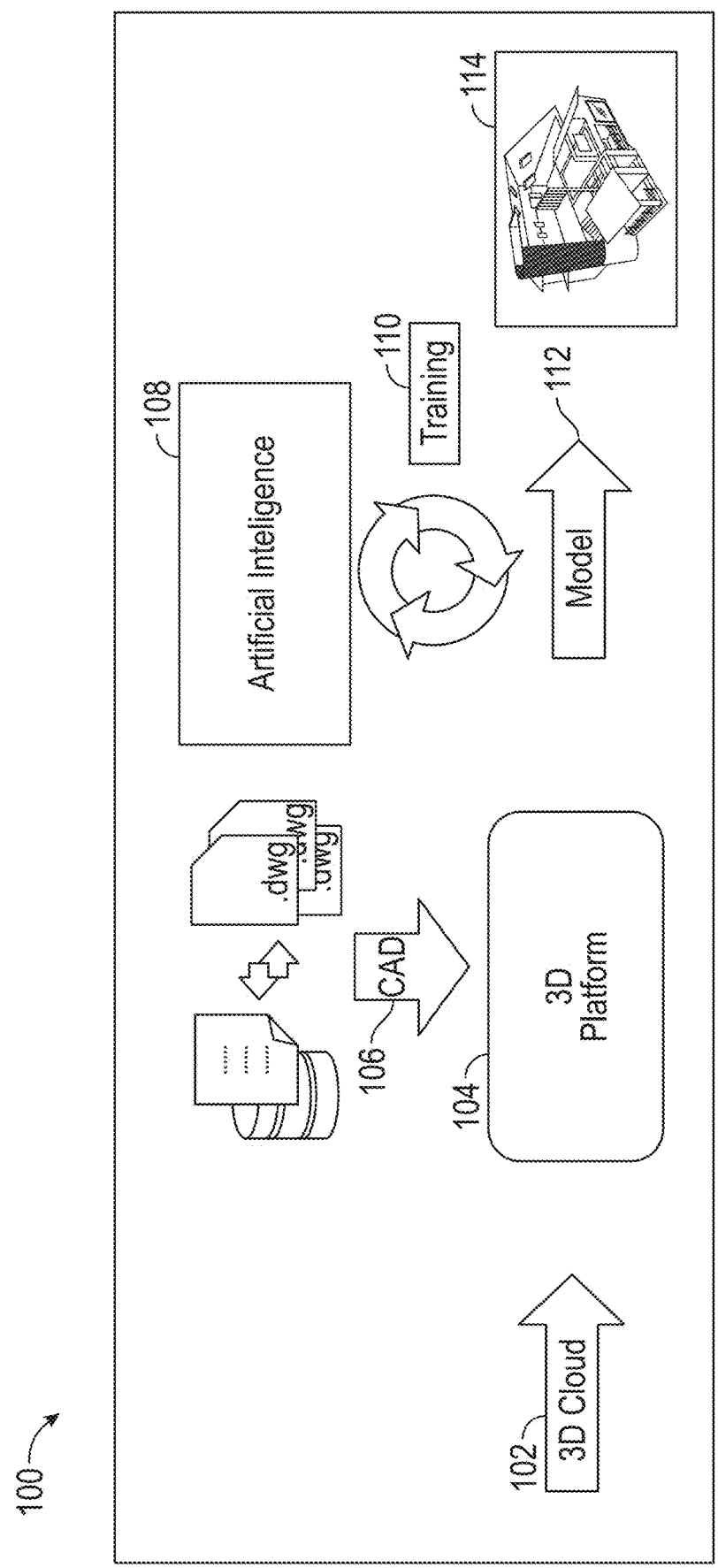
FIG. 1 is a schematic illustration of a system for converting point cloud data points into computer-aided design (CAD) objects in accordance with one or more embodiments of the present invention.

The detailed description explains embodiments of the invention, together with advantages and features, by way of example with reference to the drawings

DETAILED DESCRIPTION

One or more embodiments of the present invention relate to converting point cloud data points into computer-aided design (CAD) models. In one or more embodiments of the present invention, the converting is performed using a click and build method where a user selects a CAD object that corresponds to a set of points in point cloud. In addition or alternatively, the converting can be performed automatically by a previously trained artificial intelligence (AI) engine.

As used herein, the term "CAD object" or "object" refers to an electronic model of a physical entity, describing its surface properties and optional additional properties such as, but not limited to volume, materials and tolerances. A "CAD model" of a point cloud includes at least one or a plurality of CAD objects representing multiple items in the point cloud.

As used herein, the term "object catalog" refers to any user created or commercially available catalog of 3D CAD objects which may be stored, for example, in a database. The catalog can include, for each CAD object a valid description of the objects surface seen from outside the object. In addition, the catalog can include information of the objects internal parts, like e.g. gear wheels inside an engine. The catalog can also include meta information about the objects such as weight, materials, manufacturer, technical specifications and so on. Examples of commercially available catalogs include, but are not limited to: CAD data from KUKA Robots manufactured by KUKA Robitics Corporation; and building information modeling (BIM) catalogues such as those from MagiCAD Cloud from MagiCAD Group.

In accordance with one or more embodiments of the present invention, the object catalog includes at a minimum, for each object, a universal identifier (ID) and a description of surface 3D geometry. The object catalog can optionally include color/texture, internal CAD surfaces, reflectivity information, degrees of freedom such as length of a t-bar or radius of a spherical object, and additional properties (e.g., kinematics) for use in a simulation. The object catalog can also optionally include relations to other objects, for example, that a window belongs typical to a wall, or that pipe part will be joint by another pipe object.

Embodiments of the click and build method described herein support a user in creating a CAD model from a point cloud. The user can select an object from an object catalog and click inside a point cloud on a point that belongs to an item corresponding to that object. An algorithm can align the object to the point cloud by performing a fine adjustment of the object to the point cloud. The algorithm then outputs the aligned position and orientation of that object inside the coordinate system of the point cloud. This process can be repeated for multiple items within the point cloud. The output can be transferred to a CAD program to create a CAD model that includes all of the selected and aligned objects.

In accordance with one or more embodiments of the present invention, the CAD object is visualized in the point cloud as an overlay.

In accordance with one or more embodiments of the present invention, the points in the point cloud that represent an item and the associated CAD object are used to generate labeled data sets for training an AI engine, or AI system. The AI engine can be used to provide suggestions to the user during the click and build process, and labeled data sets for training can continue to be generated based on whether the user selects the suggested CAD object. Alternatively, or in addition, once it is fully trained, the AI engine can be used to convert the point cloud to an CAD model autonomously.

Digitization is important for documenting many workflows such as those used in building information management (BIM) and construction information management (CIM). Often, workers do not have a digital model of the current state of a space (e.g., a worksite) and have to create one in order to perform tasks related to their job. While algorithms struggle with identifying items inside large point clouds, humans can identify them relatively quickly. On the other hand, humans struggle with fine alignment of objects to the point clouds (e.g. the orientation with six-degrees of freedom of the object within the point cloud). One or more embodiments of the present invention include a method that combines the strength of humans in identification tasks with available algorithms to perform alignment with an outlook to providing an autonomous method.

The creation of a digital model is supported by tools such as laser scanners which provide high accuracy point clouds.

Engineers often already have catalogs of objects which they want to align with the point cloud to create a digital representation of reality based on CAD models. One or more embodiments of the present invention support this conversion between point clouds and CAD models.

Turning now to FIG. 1, a schematic illustration 100 of a system for converting point cloud data points into computer-aided design (CAD) objects is generally shown in accordance with one or more embodiments of the present invention. FIG. 1 includes a 3D point cloud 102 and a CAD object catalog 106 which are input to a 3D platform 104. In accordance with one or more embodiments of the present invention, the 3D platform 104 includes a processor that executes visualization software and conversion software. The visualization software is used to view the point cloud 102 and can be implemented by commercially available products such as, but not limited to: SCENE™ produced by FARO Technologies, Inc. of Lake Mary, Fla.; Autodesk ReCap produced by Autodesk, Inc of San Rafael, Calif.; and the CloudCompare from Open Source Project. The conversion software included instructions to implement the conversion from point cloud data points to CAD objects.

In one or more embodiments of the present invention, the conversion is performed by a user using a click and build process. In this process, the user selects (e.g., via a user interface screen) a point in the point cloud data (i.e., a point that is contained in an item in the point cloud that is recognized by the user) and then the user selects (e.g., via a user interface screen) an object in a CAD object catalog that corresponds to the item. The item represented by the point cloud data and recognized by the user includes a plurality of points including the point. In addition, or alternatively, the conversion can be performed using an AI engine that suggests a CAD object in a CAD object catalog based on the points that surround the point selected by the user. The user can take the suggestion from the AI engine or the user can select a different object in the catalog. Both the click and build process and the AI engine suggestion process can be used to train the AI engine by providing point cloud data points and CAD object pairs which are used to train the AI engine. In accordance with one or more embodiments, once the AI engine is fully trained, the conversion can be performed automatically by the AI engine.

The conversion software aligns the selected CAD object to the points in the point cloud that represent the item. In a first step, the selected CAD object is converted into a point cloud. The conversion can be done by a "virtual scanner" implemented using simple raytracing algorithms to capture all points on the surface of the CAD object. Both point clouds are then aligned by using cloud-to-cloud registration algorithms like e.g. ICP (iterative closest point) or RANSAC (Random sample consensus). Such algorithms then output a transformation matrix containing the desired translation and rotation.

The position and orientation of the aligned CAD object in the point cloud and an identifier of the CAD object are output from the conversion software to a CAD model 112. In addition or alternatively, the points making up the item in the point cloud and the CAD object (or the identifier of the CAD object) are used as training data 110 for AI engine 108. In addition, or alternatively, the CAD object is visualized, using the visualization software, on the point cloud as shown in block 114.

The CAD model 112 can be generated by any CAD software known in the art such as, but not limited to: Solidworks™ produced by Dassault Systemes of Velizy-Villacoublay, France; AutoCAD and Revit produced by Autodesk, Inc. of San Rafael, Calif.; and Siemens Product Lifecycle Management Software produced by Siemens Product Lifecycle Management Software, Inc. of Plano, Tex.

Figure 2:
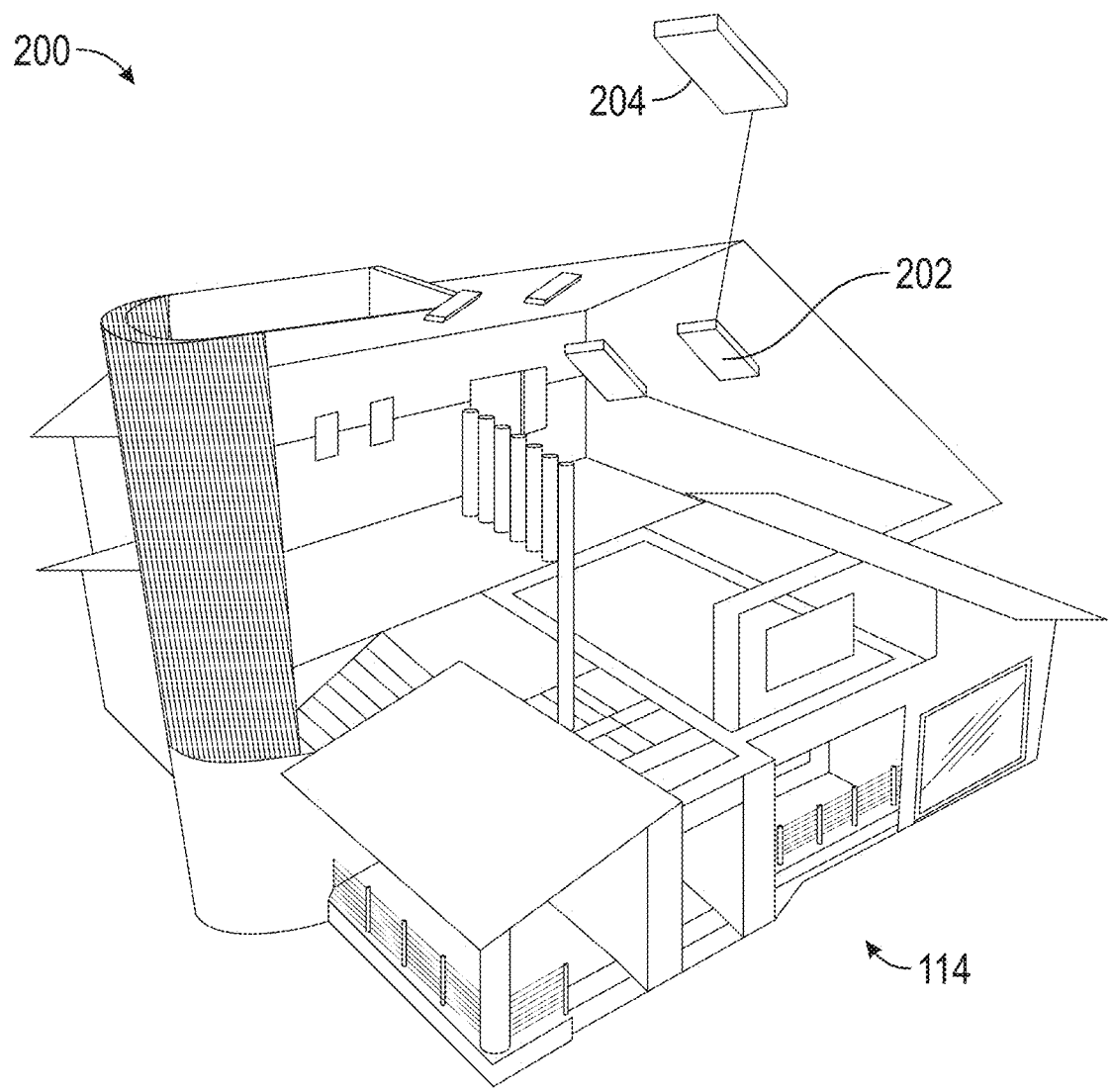
FIG. 2 is a schematic illustration of a point cloud and a CAD object in accordance with one or more embodiments of the present invention.

Turning now to FIG. 2, a schematic illustration 200 of a point cloud and a CAD object is generally shown in accordance with one or more embodiments of the present invention. Block 114 includes a point cloud (some points removed for clarity) with the solid areas representing CAD objects corresponding to a few of the items represented by a plurality of points in the point cloud. The CAD objects in block 114 are visualized, or overlaid, on the point cloud. Also shown in FIG. 2 is a point 202 in the point cloud that is within an item that is a skylight of the structure and a CAD object 204 corresponding to the skylight. In accordance with one or more embodiments of the present invention, a user interface of the conversion software can include output similar to block 114 with CAD objects overlaid on a point cloud and pages (e.g., database entries) from a CAD object catalog for the user to select from. The points in the point cloud that the CAD object is overlaying can be saved or they can be removed. When the points are removed, the point cloud is transformed into a CAD model. In the example shown in FIG. 2, the user has selected CAD object 204 which the conversion software will align to the skylight containing point 202.

Figure 3:
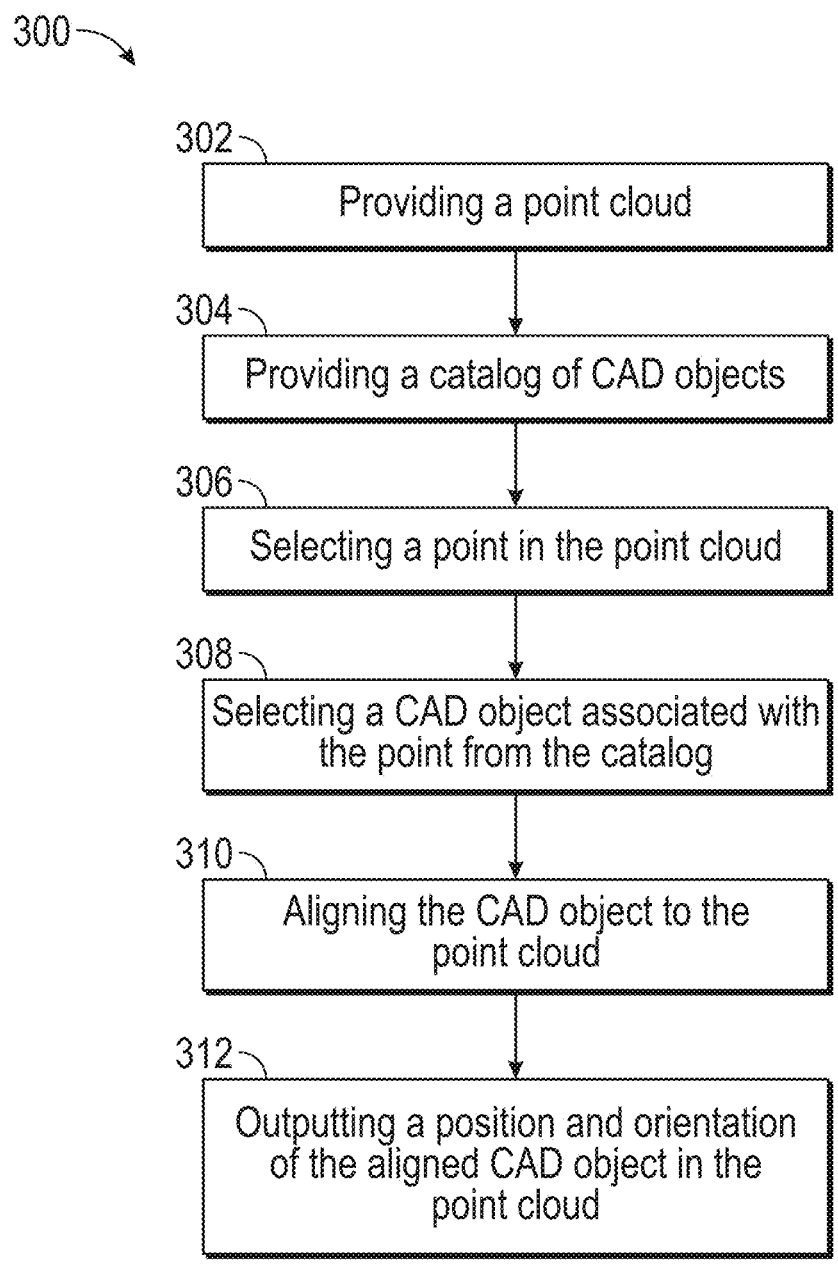
FIG. 3 is a flow diagram of a process for providing a point and click interface for converting point cloud data points into a CAD object and its three-dimensional (3D) position and orientation in accordance with one or more embodiments of the present invention.

Turning now to FIG. 3, a flow diagram 300 of a process for providing a point and click interface for converting point cloud data points into a CAD object is generally shown in accordance with one or more embodiments of the present invention. The processing shown in FIG. 3 can be performed by a processor executing the conversion software and the visualization software described herein. A point cloud is provided at block 302 and a catalog of CAD objects is provided at block 304. In one or more embodiments of the present invention, the providing a point cloud includes the conversion software and/or the visualization software receiving the point cloud from a scanner or retrieving the point cloud from a storage location. In one or more embodiments of the present invention, the catalog of CAD objects is provided by providing search access to one or more databases of CAD objects. At block 306, the user opens the point cloud, views the point cloud via a user interface, and visually identifies an item in the point cloud. The item is represented by multiple points within the point cloud and the user selects a point within the item. At block 308, the user selects, via a user interface, an object in the catalog that corresponds to the item. In accordance with one or more embodiments of the present invention, block 308 can be performed after the user has identified the item in the point cloud and prior to block 306.

At block 310 of FIG. 3, the selected CAD object is aligned to the item in the point cloud using an algorithm that fine aligns the CAD surface to the point cloud. At block 312, the algorithm returns position and orientation (e.g., expressed in a coordinate system of the point cloud), and optionally an alignment accuracy metric. In accordance with one or more embodiments of the present invention, the position and orientation are returned in terms of a 4×4 transformation matrix containing both, translation and rotation. A transformation matrix containing a 180° rotation around the x-axis and a translation of 100 units in x, 200 units in y and 300 units in z is shown below:

| 1 | 0 | 0 | 100 |
| 0 | −1 | 0 | 200 |

| | | | |
|---|---|---|---|
| 0 | 0 | 1 | 300 |
| 0 | 0 | 0 | 1 |

Since the used registration algorithms solve minimization problems appropriate accuracy metrices are RMS (root mean square) or chi-squared test value. Blocks 306 to 312 can be repeated by the user.

In accordance with one or more embodiments of the present invention, the CAD object is visualized in the point cloud and points belonging to that object are optionally removed.

In accordance with one or more embodiments of the present invention, the CAD object is visualized in a final application CAD program which shows the progress of the reengineering by visualizing all identified objects in their positions and orientation. Any CAD program known in the art can be utilized including, but not limited to those described herein above.

In accordance with one or more embodiments of the present invention, prior to the user selecting a CAD object at block 308, an AI engine, or AI system, provides a suggested CAD object to the user. The user can select the suggested CAD object at block 308 or the user can select another CAD object at block 308. Whether the user selects the CAD object or not can be used as further labeled training data for the AI system.

One or more embodiments of the present invention create training data pairs that include point cloud segments representing items and their corresponding CAD objects. This data can be used to train an AI system over time in order to provide a step by step automation of the process. In accordance with one or more embodiments of the present invention, a pair that includes the plurality of points in the point cloud (i.e., a point cloud segment) that represent the item and the CAD object is used as labeled training data for an AI system that identifies CAD objects in point clouds.

Figure 4:
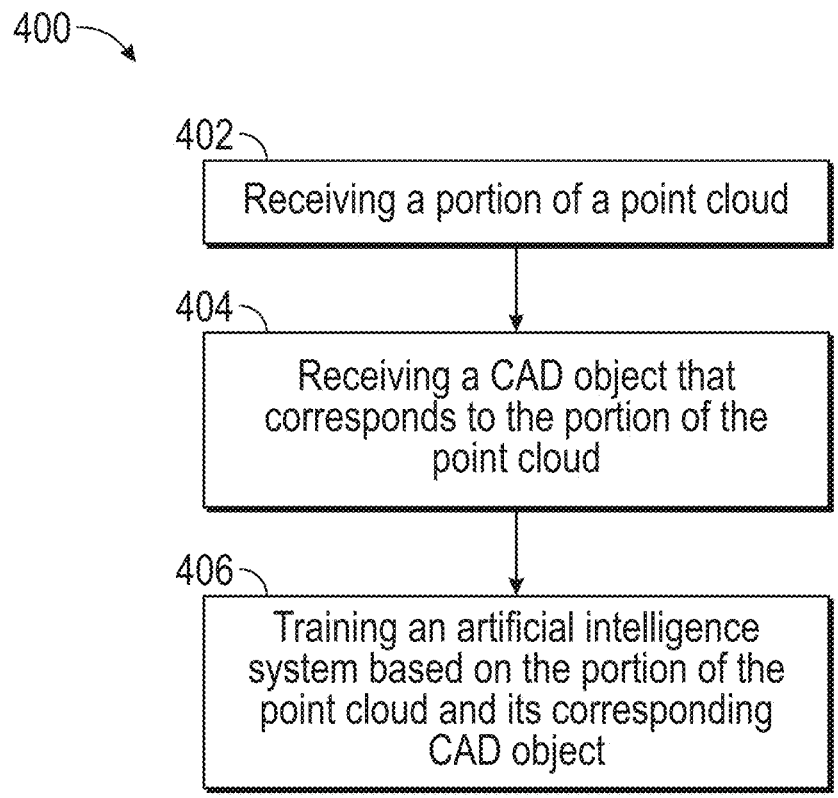
FIG. 4 is a flow diagram of a process for training an artificial intelligence (AI) system to convert point cloud data points into CAD objects in accordance with one or more embodiments of the present invention.

Turning now to FIG. 4, a flow diagram 400 of a process for training an artificial intelligence (AI) system to convert point cloud data points into a CAD objects is generally shown in accordance with one or more embodiments of the present invention. In accordance with one or more embodiments of the present invention, the processing shown in FIG. 4 is performed by an AI system, such as AI engine 108 of FIG. 1. As described previously, one or more embodiments of the present invention output pairs that include a plurality of points in the point cloud that represent an item and a corresponding CAD object. This data is used as labeled training data for training the AI system.

Referring to FIG. 4, at blocks 402-404, the pair, or labeled training data, is received. At block 402, the plurality of points in the point cloud that represent an item are received, and at block 404, the corresponding CAD object is received. At block 406, the AI system is trained based on the labeled training data. The processing shown in FIG. 4 is repeated thousands or hundreds of thousands of times or more before the AI system is fully trained. Re-training of the AI system can be performed periodically to account for new items and new CAD objects. The labeled training data can be collected automatically and in the background while the user is performing the click and build process described previously. In addition to the supervised learning based on the labeled training data, one or more embodiments of the present invention can also perform unsupervised learning.

Any type of AI algorithms can be utilized to train the AI system based on the labeled training data. For example, machine learning approaches implemented by neural networks or deep-neural networks can be utilized to recognize patterns in the training data and to select a CAD object based on a segment of the point cloud. Implementation of the AI system can be done by using Open Source machine learning libraries such as, but not limited to: TensorFlow; Keras; and Dlib.

Figure 5:
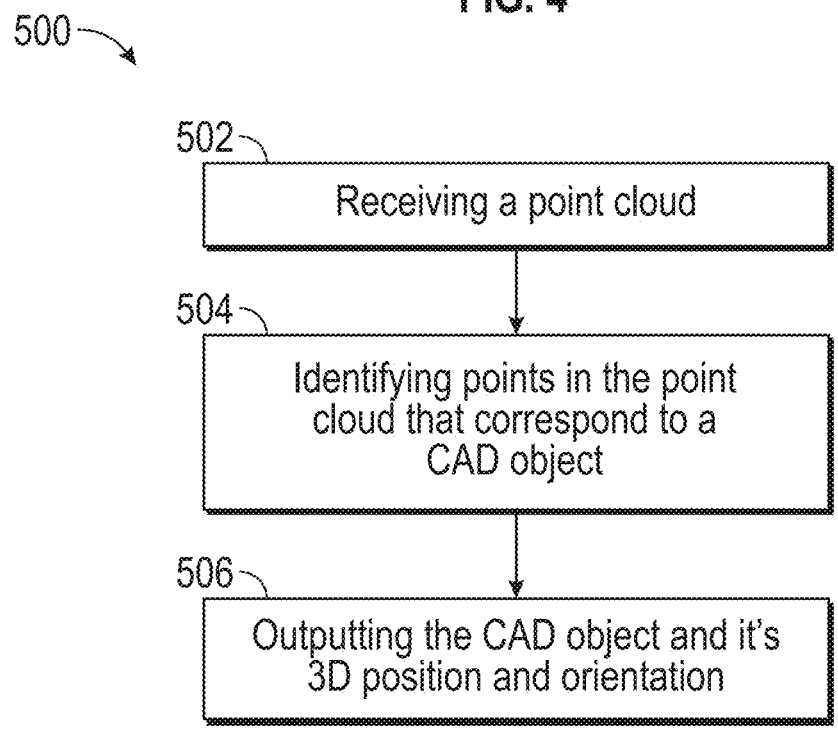
FIG. 5 is a flow diagram of an automated process for converting point cloud data points into a CAD object and its 3D position and orientation in accordance with one or more embodiments of the present invention.

Turning now to FIG. 5, a flow diagram 500 of a fully automated process for converting point cloud data points into a CAD object is generally shown in accordance with one or more embodiments of the present invention. The processing shown in FIG. 5 can be performed by conversion software in cooperation with an AI system, such as AI engine 108 of FIG. 1. At block 502, a point cloud is input to an AI system, and at block 504, the AI system identifies segments, or points, in the point cloud that correspond to a CAD object(s). At block 506, the CAD object(s) are output from the AI system and aligned to the point cloud.

In accordance with one or more embodiments of the present invention, an entire point cloud is input to the AI system. In one or more embodiments of the present invention, the point cloud is broken into portions and each portion is processed by the AI system individually. In one or more embodiments of the present invention, when the AI system is used to suggest CAD objects to a user, only the portion of the point cloud surrounding the point selected by the user is input to the AI system. Instead of selecting a point, the user can identify all of the points contained in the object (e.g., by circling the item which may result in additional points not belonging to the item) and send those points to the AI engine.

The examples given herein are related to point clouds. One skilled in the art will recognize that the same principles apply to panoramic images made up of pixels. Embodiments of the present invention can also apply to converting panoramic images to CAD models.

It is understood in advance that although this disclosure describes providing a distributed measurement system in reference to cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various user devices through a thin client interface such as a web browser (e.g., web-based e-mail) The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. In essence, cloud computing is an infrastructure made up of a network of interconnected nodes.

Figure 6:
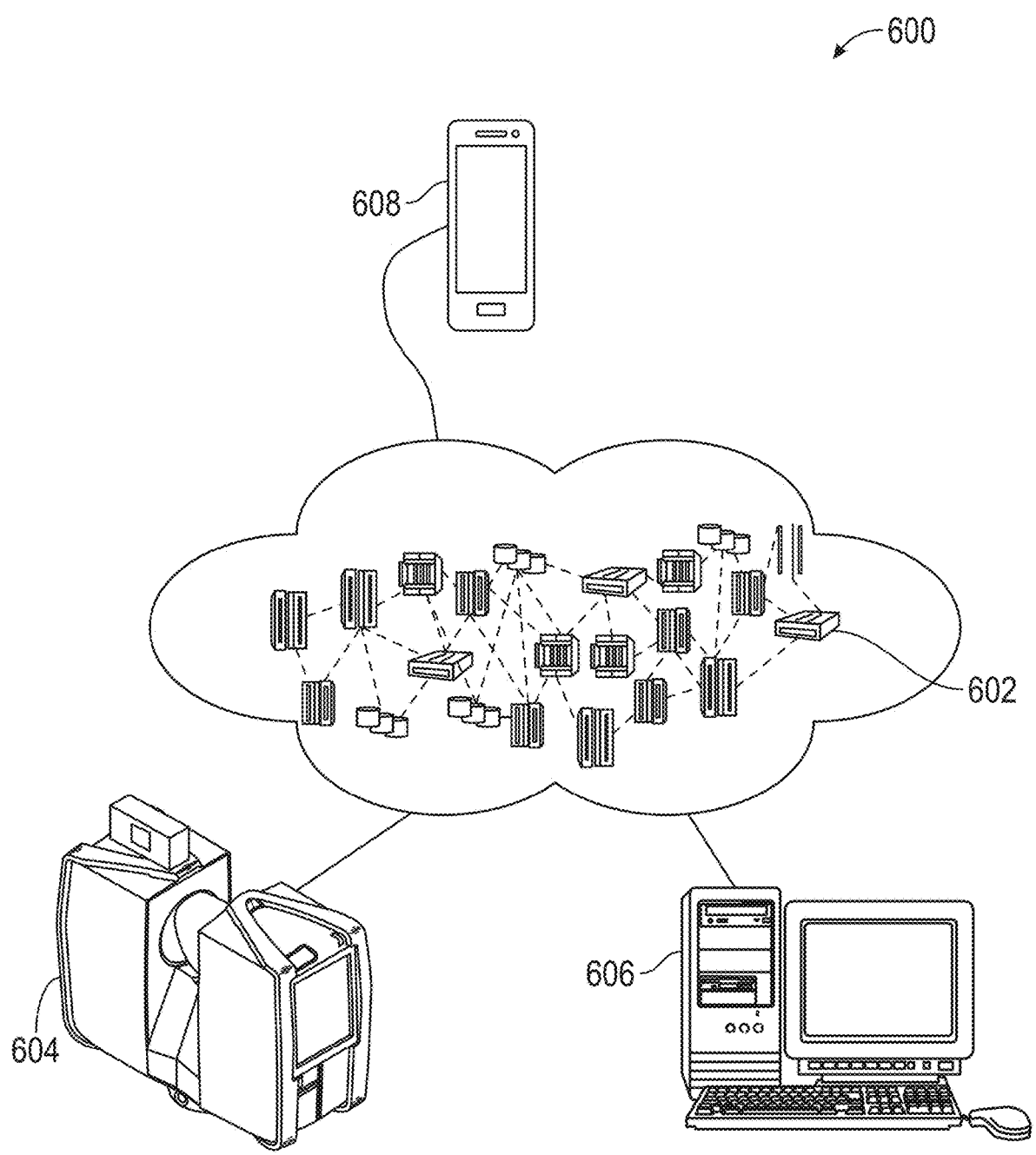
FIG. 6 is a schematic illustration of a cloud computing environment in accordance with one or more embodiments of the present invention.

Referring now to FIG. 6, an illustrative cloud computing environment 600 is depicted. As shown, cloud computing environment 600 comprises one or more cloud computing nodes 602 with which local computing devices used by cloud consumers, such as, for example, coordinate measurement device 604 and computers 606 608 may communicate. In an embodiment, the processing described herein is performed through the cooperation of computer 608 or 606, and the coordinate measurement device 604. Nodes 602 may communicate with one another. They may be grouped (not shown) physically or virtually, in one or more networks, such as Private, Community, Public, or Hybrid clouds as described hereinabove, or a combination thereof. This allows cloud computing environment 600 to offer infrastructure, platforms and/or software as services for which a cloud consumer does not need to maintain resources on a local computing device. It is understood that the types of computing devices 604-608 shown in FIG. 6 are intended to be illustrative only and that computing nodes 602 and cloud computing environment 600 can communicate with any type of computerized device over any type of network and/or network addressable connection (e.g., using a web browser).

Figure 7:
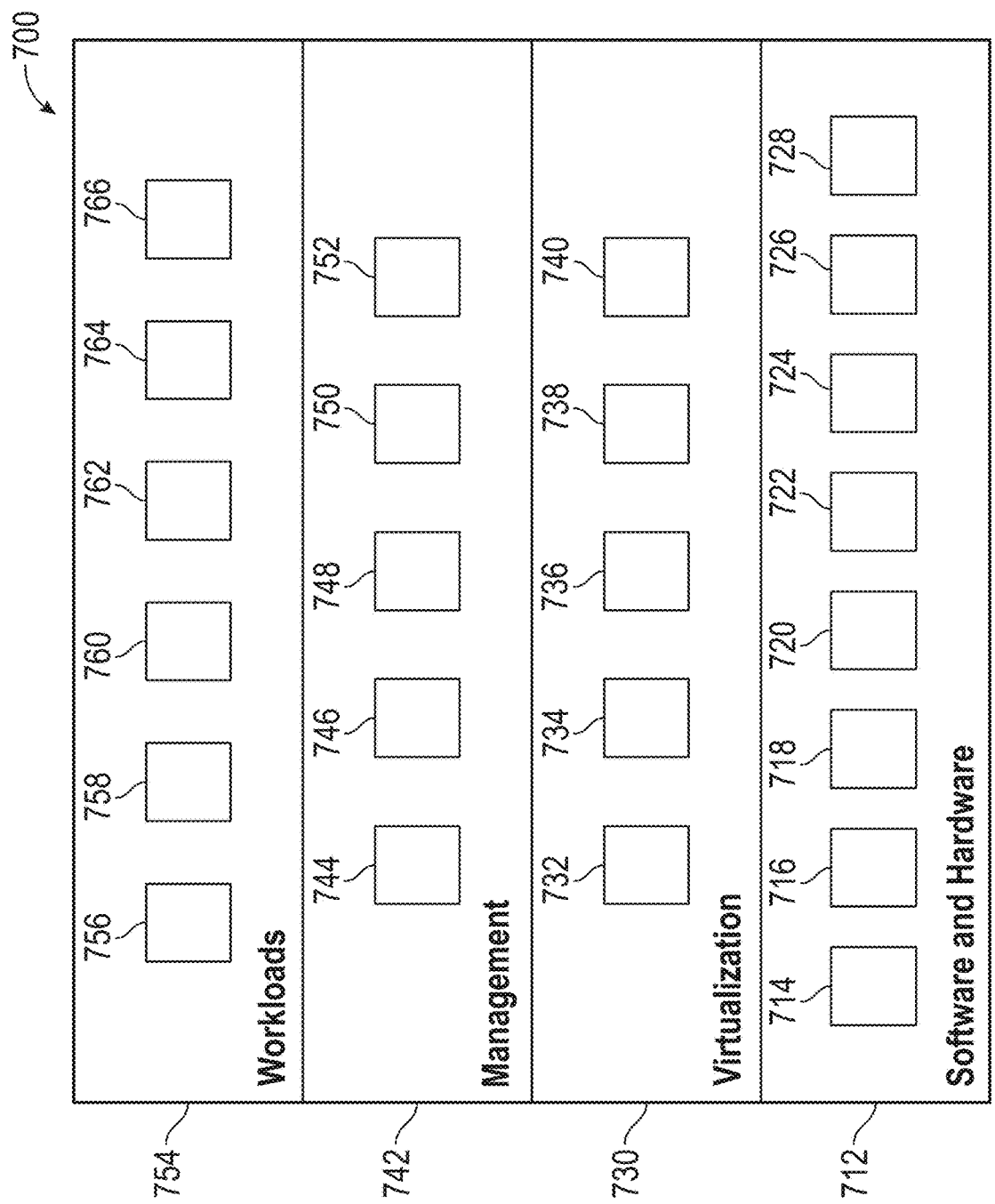
FIG. 7 is a schematic illustration of an abstraction model layers in accordance with one or more embodiments of the present invention.

Referring now to FIG. 7, a set of functional abstraction layers provided by cloud computing environment 600 (FIG. 6) is shown. It should be understood in advance that the components, layers, and functions shown in FIG. 7 are intended to be illustrative only and embodiments of the invention are not limited thereto. As depicted, the following layers and corresponding functions are provided: hardware and software layer 712 includes hardware and software components. Examples of hardware components include, but are not limited to: mainframes 714; desktop computer workstations; laptops; tablets; mobile telephones; RISC (Reduced Instruction Set Computer) architecture based servers 716; servers 718; blade servers 720; storage devices 722; and networks and networking components 724. In some embodiments hardware components are imbedded or integrated into measurement or digital asset collections system. In some embodiments, software components include network application server software 726, and database software 728; virtualization layer 730 provides an abstraction layer from which the following examples of virtual entities may be provided: virtual servers 732; virtual storage 734; virtual networks 736, including virtual private networks; virtual applications and operating systems 738; and virtual clients 740.

In one example, management layer 742 may provide the functions described below. Resource provisioning 744 provides dynamic procurement of computing resources and other resources that are utilized to perform tasks within the cloud computing environment. Metering and pricing 746 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 748 provides access to the cloud computing environment for consumers and system administrators. Service level management 750 provides cloud computing resource allocation and management such that required service levels are met. Service Level Agreement (SLA) planning and fulfillment 752 provides pre-arrangement for, and procurement of, cloud computing resources for which a future requirement is anticipated in accordance with an SLA.

Workloads layer 754 provides examples of functionality for which the cloud computing environment may be utilized. Examples of workloads and functions which may be provided from this layer include: mapping and navigation 756; software development and lifecycle management 758; transaction processing 760; scan processing software 762; distributed measurement system processing 764; and user defined content to point cloud processing 766.

Figure 8:
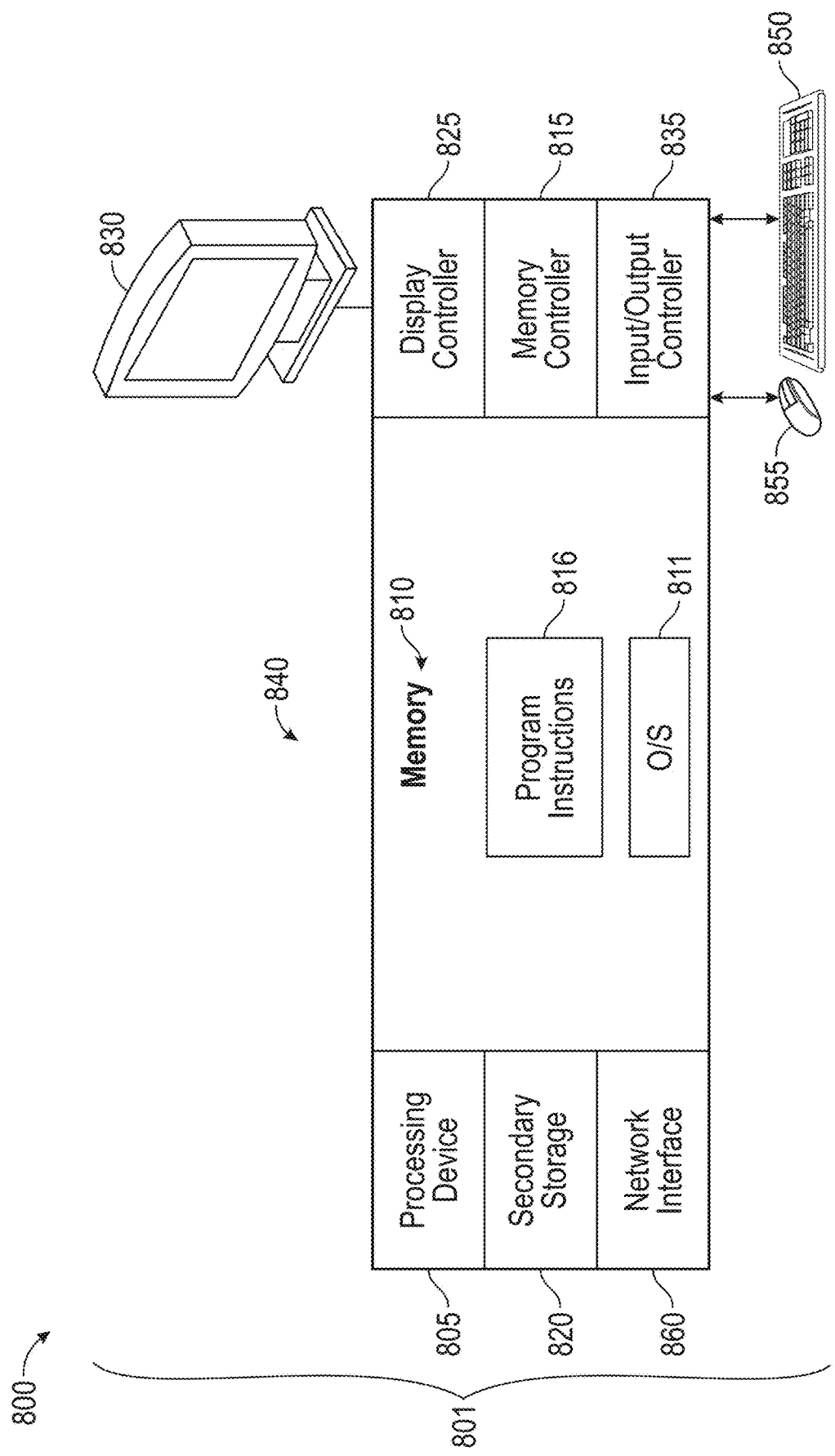
FIG. 8 is a schematic illustration of a computer system in accordance with one or more embodiments of the present invention.

Turning now to FIG. 8, a schematic illustration of a system 800 is depicted upon which aspects of one or more embodiments of providing conversion of point cloud data points into CAD objects may be implemented. In an embodiment, all or a portion of the system 800 may be incorporated into one or more of the measurement devices, user devices, and processors described herein. In one or more exemplary embodiments, in terms of hardware architecture, as shown in FIG. 8, the computer 801 includes a processing device 805 and a memory 810 coupled to a memory controller 815 and an input/output controller 835. The input/output controller 835 can be, for example, but not limited to, one or more buses or other wired or wireless connections, as is known in the art. The input/output controller 835 may have additional elements, which are omitted for simplicity, such as controllers, buffers (caches), drivers, repeaters, and receivers, to enable communications. Further, the computer 801 may include address, control, and/or data connections to enable appropriate communications among the aforementioned components.

In one or more exemplary embodiments, a keyboard 850 and mouse 855 or similar devices can be coupled to the input/output controller 835. Alternatively, input may be received via a touch-sensitive or motion sensitive interface (not depicted). The computer 801 can further include a display controller 825 coupled to a display 830.

The processing device 805 is a hardware device for executing software, particularly software stored in secondary storage 820 or memory 810. The processing device 805 can be any custom made or commercially available computer processor, a central processing unit (CPU), an auxiliary processor among several processors associated with the computer 801, a semiconductor-based microprocessor (in the form of a microchip or chip set), a macro-processor, or generally any device for executing instructions.

The memory 810 can include any one or combination of volatile memory elements (e.g., random access memory (RAM, such as DRAM, SRAM, SDRAM, etc.)) and non-volatile memory elements (e.g., ROM, erasable programmable read only memory (EPROM), electronically erasable programmable read only memory (EEPROM), flash memory, programmable read only memory (PROM), tape, compact disc read only memory (CD-ROM), flash drive, disk, hard disk drive, diskette, cartridge, cassette or the like, etc.). Moreover, the memory 810 may incorporate electronic, magnetic, optical, and/or other types of storage media. Accordingly, the memory 810 is an example of a tangible computer readable storage medium 840 upon which instructions executable by the processing device 805 may be embodied as a computer program product. The memory 810 can have a distributed architecture, where various components are situated remote from one another, but can be accessed by the processing device 805.

The instructions in memory 810 may include one or more separate programs, each of which comprises an ordered listing of executable instructions for implementing logical functions. In the example of FIG. 8, the instructions in the memory 810 include a suitable operating system (OS) 811 and program instructions 816. The operating system 811 essentially controls the execution of other computer programs and provides scheduling, input-output control, file and data management, memory management, and communication control and related services. When the computer 801 is in operation, the processing device 805 is configured to execute instructions stored within the memory 810, to communicate data to and from the memory 810, and to generally control operations of the computer 801 pursuant to the instructions. Examples of program instructions 816 can include instructions to implement the processing described herein.

The computer 801 of FIG. 8 also includes a network interface 860 that can establish communication channels with one or more other computer systems via one or more network links. The network interface 860 can support wired and/or wireless communication protocols known in the art. For example, when embodied in a user system, the network interface 860 can establish communication channels with an application server.

Any measurement device known in the art can be utilized by one or more embodiments of the present invention. A laser scanner is an example of one type of measurement device that can be utilized.

Referring now to FIGS. 9-12, a laser scanner 20 is shown for optically scanning and measuring the environment surrounding the laser scanner 20. It should be appreciated that while embodiments herein describe a phase-based time of flight scanner, this is for example purposes and the claims should not be so limited. In other embodiments, other types of three-dimensional (3D) coordinate measurement devices may be used to generate a point cloud. These 3D coordinate measurement devices include pulsed time of flight scanners, photogrammetry devices, laser line probes, triangulations scanners, area scanners, laser trackers, structured light scanners, and articulated arm coordinate measurement machines for example. The laser scanner 20 has a measuring head 22 and a base 24. The measuring head 22 is mounted on the base 24 such that the laser scanner 20 may be rotated about a vertical axis 23. In one embodiment, the measuring head 22 includes a gimbal point 27 that is a center of rotation about the vertical axis 23 and a horizontal axis 25. The measuring head 22 has a rotary mirror 26, which may be rotated about the horizontal axis 25. The rotation about the vertical axis may be about the center of the base 24. The terms vertical axis and horizontal axis refer to the scanner in its normal upright position. It is possible to operate a 3D coordinate measurement device on its side or upside down, and so to avoid confusion, the terms azimuth axis and zenith axis may be substituted for the terms vertical axis and horizontal axis, respectively. The term pan axis or standing axis may also be used as an alternative to vertical axis.

The measuring head 22 is further provided with an electromagnetic radiation emitter, such as light emitter 28, for example, that emits an emitted light beam 29. In one embodiment, the emitted light beam 29 is a coherent light beam such as a laser beam. The laser beam may have a wavelength range of approximately 300 to 1600 nanometers, for example 790 nanometers, 905 nanometers, 1550 nm, or less than 400 nanometers. It should be appreciated that other electromagnetic radiation beams having greater or smaller wavelengths may also be used. The emitted light beam 29 is amplitude or intensity modulated, for example, with a sinusoidal waveform or with a rectangular waveform. The emitted light beam 29 is emitted by the light emitter 28 onto a beam steering unit, such as mirror 26, where it is deflected to the environment. A reflected light beam 32 is reflected from the environment by an object 34. The reflected or scattered light is intercepted by the rotary mirror 26 and directed into a light receiver 36. The directions of the emitted light beam 29 and the reflected light beam 32 result from the angular positions of the rotary mirror 26 and the measuring head 22 about the axes 25 and 23, respectively. These angular positions in turn depend on the corresponding rotary drives or motors.

Coupled to the light emitter 28 and the light receiver 36 is a controller 38. The controller 38 determines, for a multitude of measuring points X, a corresponding number of distances d between the laser scanner 20 and the points X on object 34. The distance to a particular point X is determined based at least in part on the speed of light in air through which electromagnetic radiation propagates from the device to the object point X. In one embodiment the phase shift of modulation in light emitted by the laser scanner 20 and the point X is determined and evaluated to obtain a measured distance d.

The speed of light in air depends on the properties of the air such as the air temperature, barometric pressure, relative humidity, and concentration of carbon dioxide. Such air properties influence the index of refraction n of the air. The speed of light in air is equal to the speed of light in vacuum c divided by the index of refraction. In other words, $c_{air}=c/n$. A laser scanner of the type discussed herein is based on the time-of-flight (TOF) of the light in the air (the round-trip time for the light to travel from the device to the object and back to the device). Examples of TOF scanners include scanners that measure round trip time using the time interval between emitted and returning pulses (pulsed TOF scanners), scanners that modulate light sinusoidally and measure phase shift of the returning light (phase-based scanners), as well as many other types. A method of measuring distance based on the time-of-flight of light depends on the speed of light in air and is therefore easily distinguished from methods of measuring distance based on triangulation. Triangulation-based methods involve projecting light from a light source along a particular direction and then intercepting the light on a camera pixel along a particular direction. By knowing the distance between the camera and the projector and by matching a projected angle with a received angle, the method of triangulation enables the distance to the object to be determined based on one known length and two known angles of a triangle. The method of triangulation, therefore, does not directly depend on the speed of light in air.

In one mode of operation, the scanning of the volume around the laser scanner 20 takes place by rotating the rotary mirror 26 relatively quickly about axis 25 while rotating the measuring head 22 relatively slowly about axis 23, thereby, moving the assembly in a spiral pattern. In an exemplary embodiment, the rotary mirror rotates at a maximum speed of 5820 revolutions per minute. For such a scan, the gimbal point 27 defines the origin of the local stationary reference system. The base 24 rests in this local stationary reference system. In addition to measuring a distance d from the gimbal point 27 to an object point X, the scanner 20 may also collect gray-scale information related to the received optical power (equivalent to the term "brightness.") The gray-scale value may be determined at least in part, for example, by integration of the bandpass-filtered and amplified signal in the light receiver 36 over a measuring period attributed to the object point X.

In addition to measuring a distance d from the gimbal point 27 to an object point X, the scanner 20 may also collect gray-scale information related to the received optical power (equivalent to the term "brightness.") The gray-scale value may be determined at least in part, for example, by integration of the bandpass-filtered and amplified signal in the light receiver 36 over a measuring period attributed to the object point X.

Figure 9:
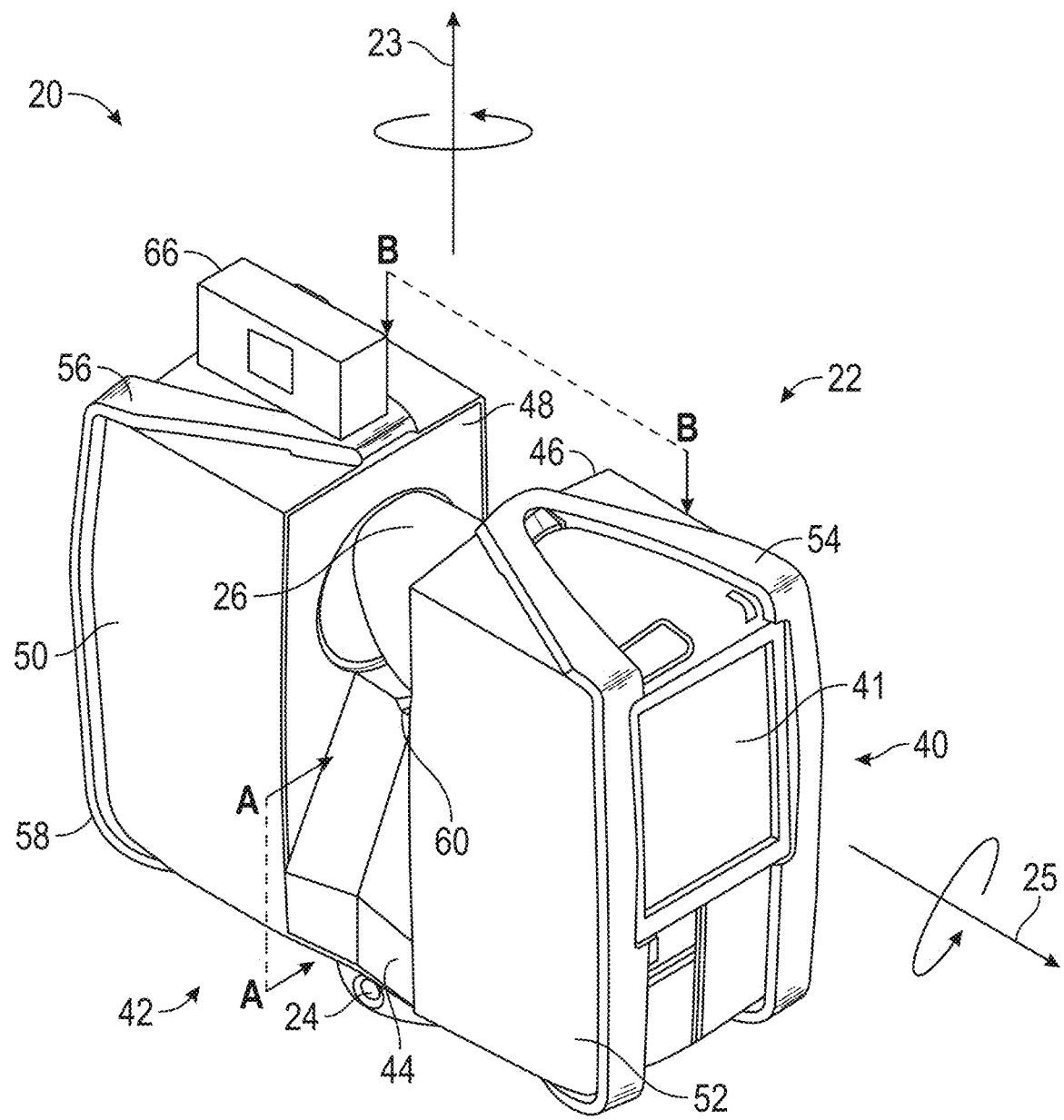
FIG. 9 is a perspective view of a laser scanner in accordance with one or more embodiments of the present invention.

The measuring head 22 may include a display device 40 integrated into the laser scanner 20. The display device 40 may include a graphical touch screen 41, as shown in FIG. 9, which allows the operator to set the parameters or initiate the operation of the laser scanner 20. For example, the screen 41 may have a user interface that allows the operator to provide measurement instructions to the device, and the screen may also display measurement results.

The laser scanner 20 includes a carrying structure 42 that provides a frame for the measuring head 22 and a platform for attaching the components of the laser scanner 20. In one embodiment, the carrying structure 42 is made from a metal such as aluminum. The carrying structure 42 includes a traverse member 44 having a pair of walls 46, 48 on opposing ends. The walls 46, 48 are parallel to each other and extend in a direction opposite the base 24. Shells 50, 52 are coupled to the walls 46, 48 and cover the components of the laser scanner 20. In the exemplary embodiment, the shells 50, 52 are made from a plastic material, such as polycarbonate or polyethylene for example. The shells 50, 52 cooperate with the walls 46, 48 to form a housing for the laser scanner 20.

On an end of the shells 50, 52 opposite the walls 46, 48 a pair of yokes 54, 56 are arranged to partially cover the respective shells 50, 52. In the exemplary embodiment, the yokes 54, 56 are made from a suitably durable material, such as aluminum for example, that assists in protecting the shells 50, 52 during transport and operation. The yokes 54, 56 each includes a first arm portion 58 that is coupled, such as with a fastener for example, to the traverse 44 adjacent the base 24. The arm portion 58 for each yoke 54, 56 extends from the traverse 44 obliquely to an outer corner of the respective shell 50, 52. From the outer corner of the shell, the yokes 54, 56 extend along the side edge of the shell to an opposite outer corner of the shell. Each yoke 54, 56 further includes a second arm portion that extends obliquely to the walls 46, 48. It should be appreciated that the yokes 54, 56 may be coupled to the traverse 42, the walls 46, 48 and the shells 50, 52 at multiple locations.

The pair of yokes 54, 56 cooperate to circumscribe a convex space within which the two shells 50, 52 are arranged. In the exemplary embodiment, the yokes 54, 56 cooperate to cover all of the outer edges of the shells 50, 52, while the top and bottom arm portions project over at least a portion of the top and bottom edges of the shells 50, 52. This provides advantages in protecting the shells 50, 52 and the measuring head 22 from damage during transportation and operation. In other embodiments, the yokes 54, 56 may include additional features, such as handles to facilitate the carrying of the laser scanner 20 or attachment points for accessories for example.

On top of the traverse 44, a prism 60 is provided. The prism extends parallel to the walls 46, 48. In the exemplary embodiment, the prism 60 is integrally formed as part of the carrying structure 42. In other embodiments, the prism 60 is a separate component that is coupled to the traverse 44. When the mirror 26 rotates, during each rotation the mirror 26 directs the emitted light beam 29 onto the traverse 44 and the prism 60. Due to non-linearities in the electronic components, for example in the light receiver 36, the measured distances d may depend on signal strength, which may be measured in optical power entering the scanner or optical power entering optical detectors within the light receiver 36, for example. In an embodiment, a distance correction is stored in the scanner as a function (possibly a nonlinear function) of distance to a measured point and optical power (generally unscaled quantity of light power sometimes referred to as "brightness") returned from the measured point and sent to an optical detector in the light receiver 36. Since the prism 60 is at a known distance from the gimbal point 27, the measured optical power level of light reflected by the prism 60 may be used to correct distance measurements for other measured points, thereby allowing for compensation to correct for the effects of environmental variables such as temperature. In the exemplary embodiment, the resulting correction of distance is performed by the controller 38.

In an embodiment, the base 24 is coupled to a swivel assembly (not shown) such as that described in commonly owned U.S. Pat. No. 8,705,012 ('012), which is incorporated by reference herein. The swivel assembly is housed within the carrying structure 42 and includes a motor 138 that is configured to rotate the measuring head 22 about the axis 23. In an embodiment, the angular/rotational position of the measuring head 22 about the axis 23 is measured by angular encoder 134.

An auxiliary image acquisition device 66 may be a device that captures and measures a parameter associated with the scanned area or the scanned object and provides a signal representing the measured quantities over an image acquisition area. The auxiliary image acquisition device 66 may be, but is not limited to, a pyrometer, a thermal imager, an ionizing radiation detector, or a millimeter-wave detector. In an embodiment, the auxiliary image acquisition device 66 is a color camera.

In an embodiment, a central color camera (first image acquisition device) 112 is located internally to the scanner and may have the same optical axis as the 3D scanner device. In this embodiment, the first image acquisition device 112 is integrated into the measuring head 22 and arranged to acquire images along the same optical pathway as emitted light beam 29 and reflected light beam 32. In this embodiment, the light from the light emitter 28 reflects off a fixed mirror 116 and travels to dichroic beam-splitter 118 that reflects the light 117 from the light emitter 28 onto the rotary mirror 26. In an embodiment, the mirror 26 is rotated by a motor 136 and the angular/rotational position of the mirror is measured by angular encoder 134. The dichroic beam-splitter 118 allows light to pass through at wavelengths different than the wavelength of light 117. For example, the light emitter 28 may be a near infrared laser light (for example, light at wavelengths of 780 nm or 1150 nm), with the dichroic beam-splitter 118 configured to reflect the infrared laser light while allowing visible light (e.g., wavelengths of 400 to 700 nm) to transmit through. In other embodiments, the determination of whether the light passes through the beam-splitter 118 or is reflected depends on the polarization of the light. The digital camera 111 obtains 2D images of the scanned area to capture color data to add to the scanned image. In the case of a built-in color camera having an optical axis coincident with that of the 3D scanning device, the direction of the camera view may be easily obtained by simply adjusting the steering mechanisms of the scanner—for example, by adjusting the azimuth angle about the axis 23 and by steering the mirror 26 about the axis 25.

Figure 10:
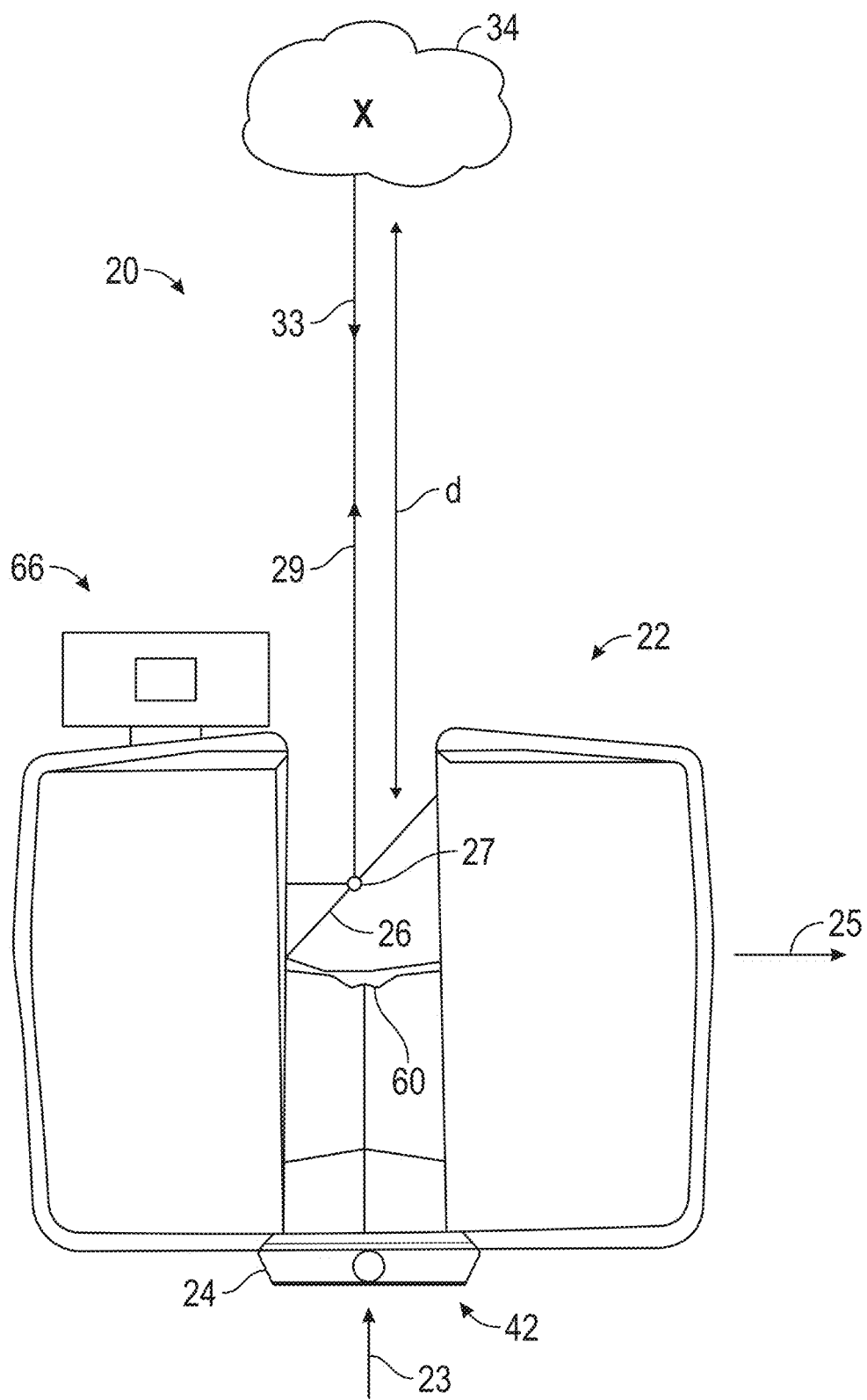
FIG. 10 is a side view of the laser scanner illustrating a method of measurement in accordance with one or more embodiments of the present invention.
Figure 11:
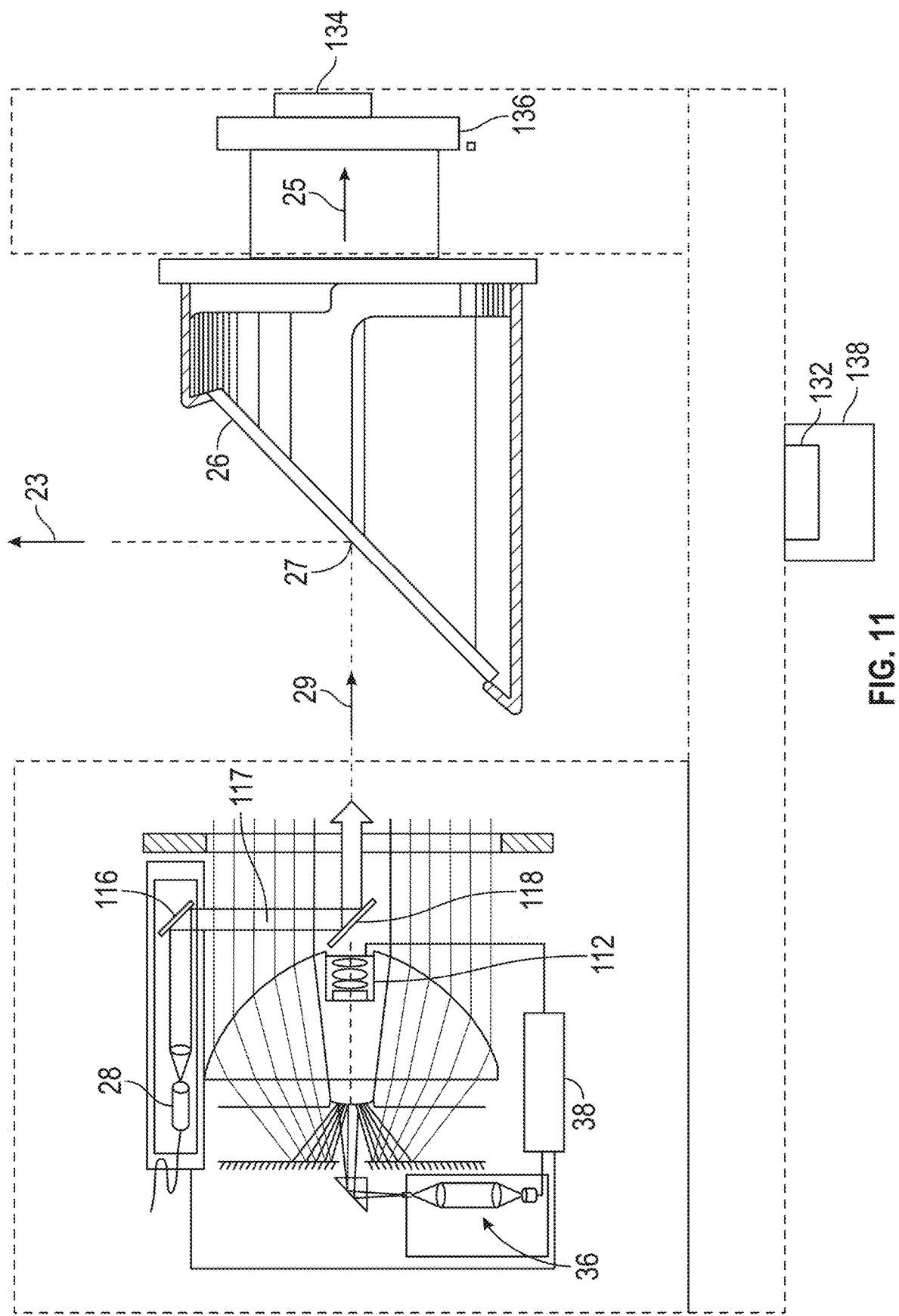
FIG. 11 is a schematic illustration of the optical, mechanical, and electrical components of the laser scanner in accordance with one or more embodiments of the present invention.
Figure 12:
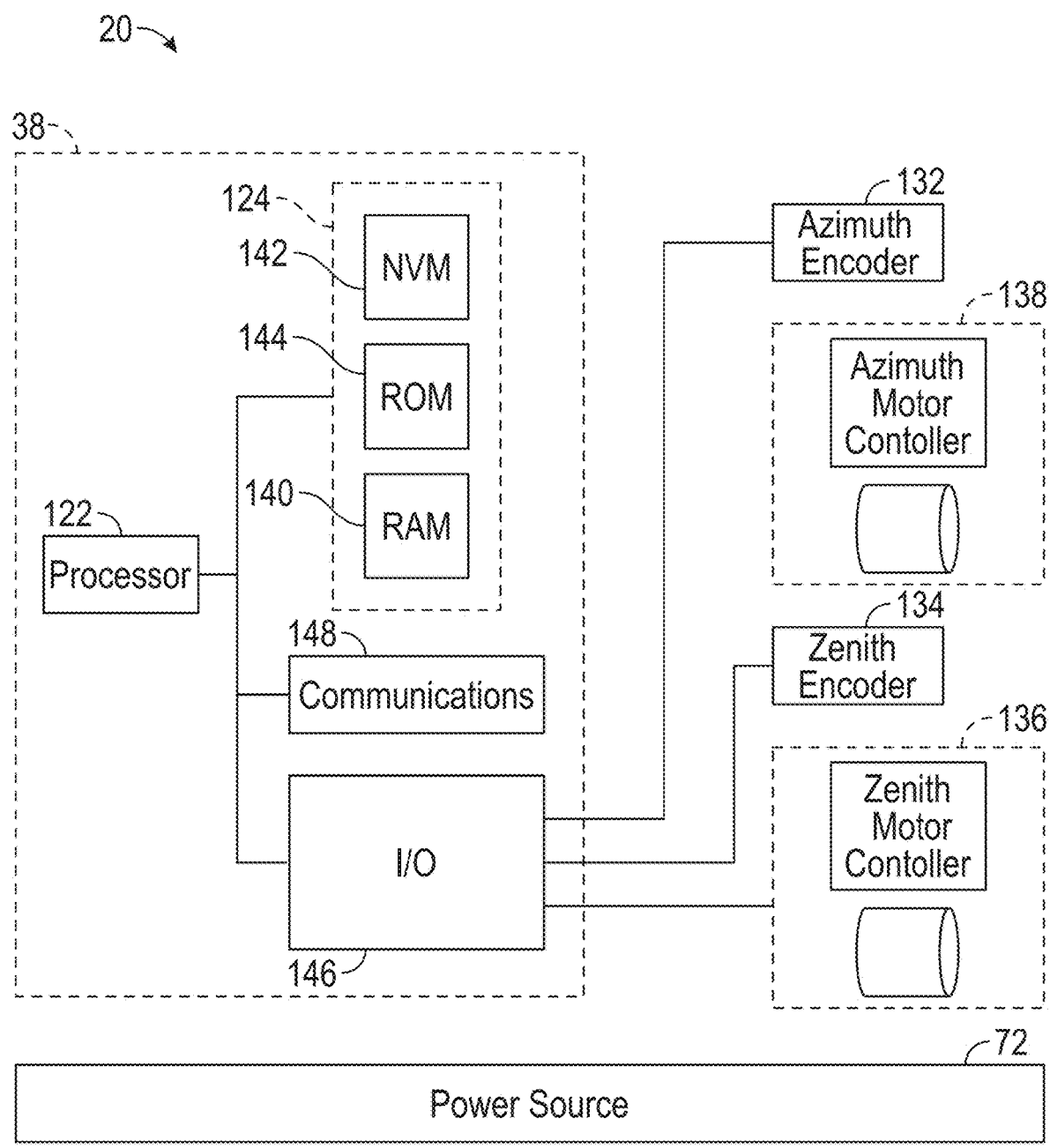
FIG. 12 is a schematic illustration of the laser scanner of FIG. 9 in accordance with one or more embodiments of the present invention.

Referring now to FIG. 12 with continuing reference to FIGS. 9-11, elements are shown of the laser scanner 20. Controller 38 is a suitable electronic device capable of accepting data and instructions, executing the instructions to process the data, and presenting the results. The controller 38 includes one or more processing elements 122. The processors may be microprocessors, field programmable gate arrays (FPGAs), digital signal processors (DSPs), and generally any device capable of performing computing functions. The one or more processors 122 have access to memory 124 for storing information.

Controller 38 is capable of converting the analog voltage or current level provided by light receiver 36 into a digital signal to determine a distance from the laser scanner 20 to an object in the environment. Controller 38 uses the digital signals that act as input to various processes for controlling the laser scanner 20. The digital signals represent one or more laser scanner 20 data including but not limited to distance to an object, images of the environment, images acquired by panoramic camera 126, angular/rotational measurements by a first or azimuth encoder 132, and angular/rotational measurements by a second axis or zenith encoder 134.

In general, controller 38 accepts data from encoders 132, 134, light receiver 36, light source 28, and panoramic camera 126 and is given certain instructions for the purpose of generating a 3D point cloud of a scanned environment. Controller 38 provides operating signals to the light source 28, light receiver 36, panoramic camera 126, zenith motor 136 and azimuth motor 138. The controller 38 compares the operational parameters to predetermined variances and if the predetermined variance is exceeded, generates a signal that alerts an operator to a condition. The data received by the controller 38 may be displayed on a user interface coupled to controller 38. The user interface may be one or more LEDs (light-emitting diodes) 82, an LCD (liquid-crystal diode) display, a CRT (cathode ray tube) display, a touch-screen display or the like. A keypad may also be coupled to the user interface for providing data input to controller 38. In one embodiment, the user interface is arranged or executed on a mobile computing device that is coupled for communication, such as via a wired or wireless communications medium (e.g. Ethernet, serial, USB, Bluetooth™ or WiFi) for example, to the laser scanner 20.

The controller 38 may also be coupled to external computer networks such as a local area network (LAN) and the Internet. A LAN interconnects one or more remote computers, which are configured to communicate with controller 38 using a well-known computer communications protocol such as TCP/IP (Transmission Control Protocol/Internet(ˆ) Protocol), RS-232, ModBus, and the like. Additional systems may also be connected to LAN with the controllers 38 in each of these systems being configured to send and receive data to and from remote computers and other systems. The LAN may be connected to the Internet. This connection allows controller 38 to communicate with one or more remote computers connected to the Internet.

The processors 122 are coupled to memory 124. The memory 124 may include random access memory (RAM) device 140, a non-volatile memory (NVM) device 142, and a read-only memory (ROM) device 144. In addition, the processors 122 may be connected to one or more input/output (I/O) controllers 146 and a communications circuit 148. In an embodiment, the communications circuit 92 provides an interface that allows wireless or wired communication with one or more external devices or networks, such as the LAN discussed above.

Controller 38 includes operation control methods embodied in computer instructions written to be executed by processors 122, typically in the form of software. The software can be encoded in any language, including, but not limited to, assembly language, VHDL (Verilog Hardware Description Language), VHSIC HDL (Very High Speed IC Hardware Description Language), Fortran (formula translation), C, C++, C #, Objective-C, Visual C++, Java, ALGOL (algorithmic language), BASIC (beginners all-purpose symbolic instruction code), visual BASIC, ActiveX, HTML (HyperText Markup Language), Python, Ruby and any combination or derivative of at least one of the foregoing.

It will be appreciated that aspects of the present invention may be embodied as a system, method, or computer program product and may take the form of a hardware embodiment, a software embodiment (including firmware, resident software, micro-code, etc.), or a combination thereof. Furthermore, aspects of the present invention may take the form of a computer program product embodied in one or more computer readable medium(s) having computer readable program code embodied thereon.

One or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In one aspect, the computer readable storage medium may be a tangible medium containing or storing a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

The computer readable medium may contain program code embodied thereon, which may be transmitted using any appropriate medium, including but not limited to wireless, wireline, optical fiber cable, RF, etc., or any suitable combination of the foregoing. In addition, computer program code for carrying out operations for implementing aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server.

It will be appreciated that aspects of the present invention are described herein with reference to flowchart illustrations and/or block diagrams of methods, apparatus (systems) and computer program products according to embodiments of the invention. It will be understood that each block or step of the flowchart illustrations and/or block diagrams, and combinations of blocks or steps in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In addition, some embodiments described herein are associated with an "indication". As used herein, the term "indication" may be used to refer to any indicia and/or other information indicative of or associated with a subject, item, entity, and/or other object and/or idea. As used herein, the phrases "information indicative of" and "indicia" may be used to refer to any information that represents, describes, and/or is otherwise associated with a related entity, subject, or object. Indicia of information may include, for example, a code, a reference, a link, a signal, an identifier, and/or any combination thereof and/or any other informative representation associated with the information. In some embodiments, indicia of information (or indicative of the information) may be or include the information itself and/or any portion or component of the information. In some embodiments, an indication may include a request, a solicitation, a broadcast, and/or any other form of information gathering and/or dissemination.

Numerous embodiments are described in this patent application, and are presented for illustrative purposes only. The described embodiments are not, and are not intended to be, limiting in any sense. The presently disclosed invention(s) are widely applicable to numerous embodiments, as is readily apparent from the disclosure. One of ordinary skill in the art will recognize that the disclosed invention(s) may be practiced with various modifications and alterations, such as structural, logical, software, and electrical modifications. Although particular features of the disclosed invention(s) may be described with reference to one or more particular embodiments and/or drawings, it should be understood that such features are not limited to usage in the one or more particular embodiments or drawings with reference to which they are described, unless expressly specified otherwise.

Devices that are in communication with each other need not be in continuous communication with each other, unless expressly specified otherwise. On the contrary, such devices need only transmit to each other as necessary or desirable, and may actually refrain from exchanging data most of the time. For example, a machine in communication with another machine via the Internet may not transmit data to the other machine for weeks at a time. In addition, devices that are in communication with each other may communicate directly or indirectly through one or more intermediaries.

A description of an embodiment with several components or features does not imply that all or even any of such components and/or features are required. On the contrary, a variety of optional components are described to illustrate the wide variety of possible embodiments of the present invention(s). Unless otherwise specified explicitly, no component and/or feature is essential or required.

Further, although process steps, algorithms or the like may be described in a sequential order, such processes may be configured to work in different orders. In other words, any sequence or order of steps that may be explicitly described does not necessarily indicate a requirement that the steps be performed in that order. The steps of processes described herein may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the invention, and does not imply that the illustrated process is preferred.

"Determining" something can be performed in a variety of manners and therefore the term "determining" (and like terms) includes calculating, computing, deriving, looking up (e.g., in a table, database or data structure), ascertaining and the like.

It will be readily apparent that the various methods and algorithms described herein may be implemented by, e.g., appropriately and/or specially-programmed general purpose computers and/or computing devices. Typically a processor (e.g., one or more microprocessors) will receive instructions from a memory or like device, and execute those instructions, thereby performing one or more processes defined by those instructions. Further, programs that implement such methods and algorithms may be stored and transmitted using a variety of media (e.g., computer readable media) in a number of manners. In some embodiments, hard-wired circuitry or custom hardware may be used in place of, or in combination with, software instructions for implementation of the processes of various embodiments. Thus, embodiments are not limited to any specific combination of hardware and software.

A "processor" generally means any one or more microprocessors, digital CPU devices, GPU devices, computing devices, microcontrollers, digital signal processors (DSPs), field programmable gate arrays (FPGAs), or like devices, as further described herein. A CPU typically performs a variety of tasks while a GPU is optimized to display or process images and/or 3D datasets.

Where databases are described, it will be understood by one of ordinary skill in the art that (i) alternative database structures to those described may be readily employed, and (ii) other memory structures besides databases may be readily employed. Any illustrations or descriptions of any sample databases presented herein are illustrative arrangements for stored representations of information. Any number of other arrangements may be employed besides those suggested by, e.g., tables illustrated in drawings or elsewhere. Similarly, any illustrated entries of the databases represent exemplary information only; one of ordinary skill in the art will understand that the number and content of the entries can be different from those described herein. Further, despite any depiction of the databases as tables, other formats (including relational databases, object-based models and/or distributed databases) could be used to store and manipulate the data types described herein. Likewise, object methods or behaviors of a database can be used to implement various processes, such as the described herein. In addition, the databases may, in a known manner, be stored locally or remotely from a device that accesses data in such a database.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

Terms such as processor, controller, computer, DSP, FPGA are understood in this document to mean a computing device that may be located within an instrument, distributed in multiple elements throughout an instrument, or placed external to an instrument.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The term "about" is intended to include the degree of error associated with measurement of the particular quantity based upon the equipment available at the time of filing the application. For example, "about" can include a range of ±8% or 5%, or 2% of a given value.

What is claimed is:

1. A method for converting from point cloud data to computer-aided design (CAD) objects, the method comprising:
    providing a first point cloud;
    providing a catalog of CAD objects;
    selecting an item in the first point cloud;
    providing a suggested CAD object from the catalog of CAD objects based on a determination that the suggested CAD object corresponds to the item;
    selecting a CAD object in the catalog that corresponds to the item;
    aligning, by a processor, the CAD object to the item in the first point cloud, the aligning comprising executing a virtual scanner to convert the CAD object into a second point cloud and aligning the second point cloud with the item in the first point cloud;
    outputting a position and orientation of the aligned CAD object, the position and orientation expressed in a coordinate system of the point cloud.

2. The method of claim 1, wherein the selecting an item, the selecting a CAD object, the aligning, and the outputting are repeated for at least one additional item in the first point cloud.

3. The method of claim 1, wherein the outputting is to a CAD model.

4. The method of claim 1, wherein the first point cloud comprises a plurality of items including the item and the CAD object is visualized on the first point cloud.

5. The method of claim 1, wherein a pair that includes the item in the first point cloud and the CAD object are used as labeled training data for an artificial intelligence (AI) system that identifies CAD objects in point clouds.

6. The method of claim 1, wherein an AI system provides the suggested CAD object to a user, wherein the selecting a CAD object comprises the user selecting the suggested CAD object as the CAD object or selecting another CAD object as the CAD object.

7. The method of claim 1, wherein the selecting an item in the first point cloud is performed by an AI system.

8. The method of claim 1, wherein the CAD object has an identifier identifying a type of the object.

9. The method of claim 1, further comprising generating the first point cloud using a three-dimensional (3D) scanner.

10. The method of claim 9, wherein the scanner is a laser scanner.

11. A system for converting from point cloud data to computer-aided design (CAD) objects, the system comprising:
   a memory having computer readable instructions; and
   one or more processors for executing the computer readable instructions, the computer readable instructions controlling the one or more processors to perform operations comprising:
      providing a first point cloud;
      providing a catalog of CAD objects;
      selecting an item in the first point cloud-;
      providing a suggested CAD object from the catalog of CAD objects based on a determination that the suggested CAD object corresponds to the item;
      selecting a CAD object in the catalog that corresponds to the item;
      aligning, by a processor, the CAD object to the item in the first point cloud, the aligning comprising executing a virtual scanner to convert the CAD object into a second point cloud and aligning the second point cloud with the item in the first point cloud;
         outputting a position and orientation of the aligned CAD object, the position and orientation expressed in a coordinate system of the point cloud.

12. The system of claim 11, wherein the selecting an item, the selecting a CAD object, the aligning, and the outputting are repeated for at least one additional item in the first point cloud.

13. The system of claim 11, wherein the outputting is to a CAD model.

14. The system of claim 11, wherein the first point cloud comprises a plurality of items including the item and the CAD object is visualized on the first point cloud.

15. The system of claim 11, wherein a pair that includes the item in the first point cloud and the CAD object are used as labeled training data for an artificial intelligence (AI) system that identifies CAD objects in point clouds.

16. The system of claim 11, wherein an AI system provides the suggested CAD object to a user, wherein the selecting a CAD object comprises the user selecting the suggested CAD object as the CAD object or selecting another CAD object as the CAD object.

17. The system of claim 11, wherein the selecting an item in the first point cloud is performed by an AI system.

18. The system of claim 11, wherein the operations further comprise generating the first point cloud using a scanner.

* * * * *